United States Patent
Pagaila et al.

(10) Patent No.: US 7,911,070 B2
(45) Date of Patent: Mar. 22, 2011

(54) INTEGRATED CIRCUIT PACKAGING SYSTEM HAVING PLANAR INTERCONNECT

(75) Inventors: Reza Argenty Pagaila, Singapore (SG); Byung Tai Do, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 69 days.

(21) Appl. No.: 12/238,153

(22) Filed: Sep. 25, 2008

(65) Prior Publication Data

US 2010/0072596 A1    Mar. 25, 2010

(51) Int. Cl.
*H01L 23/28* (2006.01)

(52) U.S. Cl. .................. 257/787; 257/784; 257/786

(58) Field of Classification Search .................. 257/784, 257/686, 723, 724, 777, 786
See application file for complete search history.

(56) References Cited

U.S. PATENT DOCUMENTS

| | | |
|---|---|---|
| 6,607,938 B2 | 8/2003 | Kwon et al. |
| 6,800,930 B2 | 10/2004 | Jackson et al. |
| 6,861,761 B2 | 3/2005 | Yang et al. |
| 7,355,273 B2 | 4/2008 | Jackson et al. |
| 7,569,920 B2 * | 8/2009 | Otremba et al. ............. 257/686 |
| 7,598,603 B2 * | 10/2009 | Otremba ..................... 257/675 |
| 2003/0189250 A1 * | 10/2003 | Jin et al. ..................... 257/737 |
| 2004/0155360 A1 * | 8/2004 | Akram ........................ 257/782 |
| 2007/0138618 A1 | 6/2007 | Park et al. |
| 2008/0136003 A1 | 6/2008 | Pendse |
| 2009/0039493 A1 * | 2/2009 | Chou et al. .................. 257/686 |

* cited by examiner

*Primary Examiner* — S. V Clark
(74) *Attorney, Agent, or Firm* — Mikio Ishimaru (57) ABSTRACT

An integrated circuit package system includes: mounting an integrated circuit, having a planar interconnect, over a carrier with the planar interconnect at a non-active side of the integrated circuit and an active side of the integrated circuit facing the carrier; connecting the integrated circuit and the carrier; connecting the planar interconnect and the carrier; and forming an encapsulation over the integrated circuit, the carrier, and the planar interconnect.

9 Claims, 7 Drawing Sheets

INTEGRATED CIRCUIT PACKAGING SYSTEM HAVING PLANAR INTERCONNECT

TECHNICAL FIELD

The present invention relates generally to an integrated circuit package system and more particularly to an integrated circuit package system having an encapsulation.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package on package (POP).

Typically, semiconductor packages containing multiple integrated circuits require either special connection sites on the base substrate, an interposer between semiconductor dice, or both in order for both integrated circuits to communicate with the base substrate. Such an arrangement increases vertical and horizontal profile, increases the number of manufacturing steps as well as cost of the resultant package.

Thus, a need still remains for an integrated circuit packaging system providing low profile, low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit packaging system including mounting an integrated circuit, having a planar interconnect, over a carrier with the planar interconnect at a non-active side of the integrated circuit and an active side of the integrated circuit facing the carrier; connecting the integrated circuit and the carrier; connecting the planar interconnect and the carrier; and forming an encapsulation over the integrated circuit, the carrier, and the planar interconnect.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Figure 1:
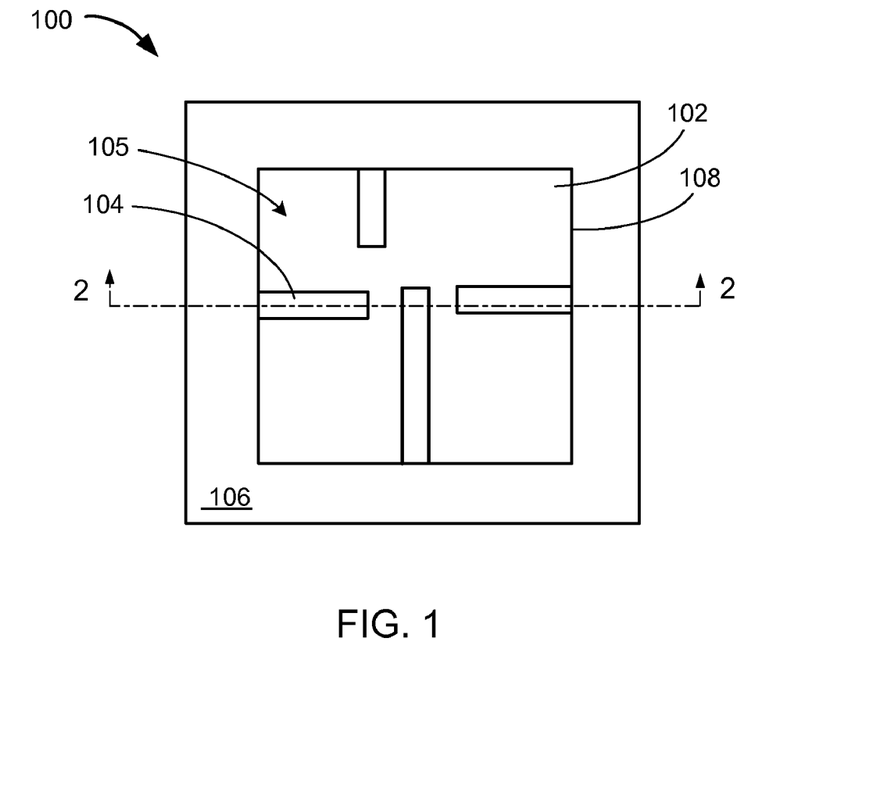
FIG. 1 is a top view of an integrated circuit package system in a first embodiment of the present invention.

Referring now to FIG. 1, therein is shown a top view of an integrated circuit package system 100 in a first embodiment of the present invention. The top view depicts an integrated circuit 102, such as an integrated circuit die, having a planar interconnect 104. The planar interconnect 104 can be along a non-active side 105 and is flat with no bends over the length thereof along one plane from end to end.

The planar interconnect 104 can be formed on the integrated circuit 102 at wafer level. The planar interconnect 104 can include a protection layer (not shown) to seal portions of the planar interconnect 104 and exposing other portions for electrical connection. An encapsulation 106, such as a cover including an epoxy molding compound, can be over the integrated circuit 102. The encapsulation 106 can include a cavity 108 exposing the integrated circuit 102 and the planar interconnect 104.

Figure 2:
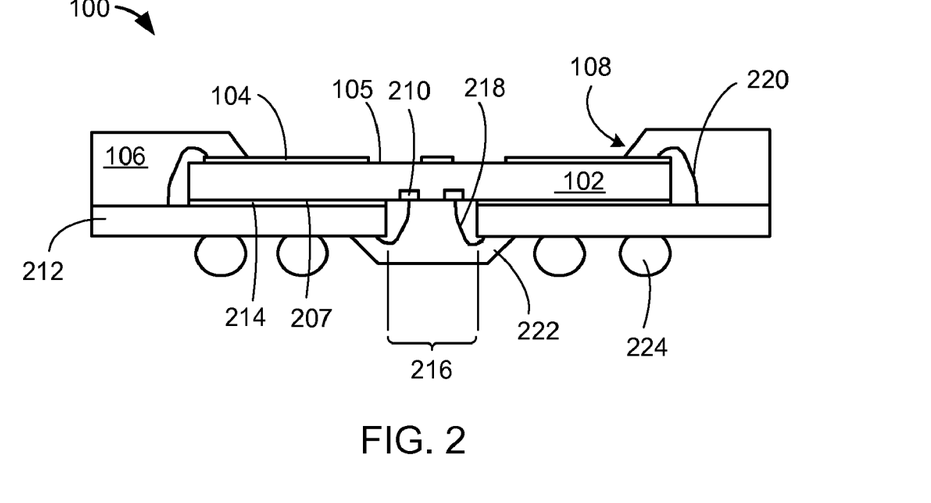
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The integrated circuit 102 includes the non-active side 105 and an active side 207 with the active side 207 having active circuitry fabricated thereon.

The integrated circuit 102 can be mounted over a carrier 212, such as a substrate, using an adhesive 214, such as a die attach adhesive. Connection sites 210, such as bond pads, at the active side 207, can be facing the carrier 212. The carrier 212 can have an opening 216. The integrated circuit 102 can be positioned over the carrier 212 such that the connection sites 210 are over the opening 216.

A first interconnect 218, such as a bond wire or ribbon bond wire, can connect the connection sites 210 and the carrier 212 through the opening 216. A second interconnect 220, such as a bond wire or ribbon bond wire, can connect the planar interconnect 104 and the carrier 212. The encapsulation 106 can be formed over the carrier 212 covering the first interconnect 218 and the second interconnect 220.

The encapsulation 106 can form the cavity 108 over the carrier 212 exposing a portion of the planar interconnect 104. The encapsulation 106 can form a protrusion 222 under the opening 216 and under the carrier 212. The protrusion 222 can extend beyond the opening 216 for sealing the first interconnect 218. Package interconnects 224, such as solder balls, can attach to and below the carrier 212.

It has been discovered that the present invention provides an integrated circuit package system with lower vertical profile. The integrated circuit package system has a lower vertical profile by forming a planar interconnect along the non-active side of the integrated circuit.

Figure 3:
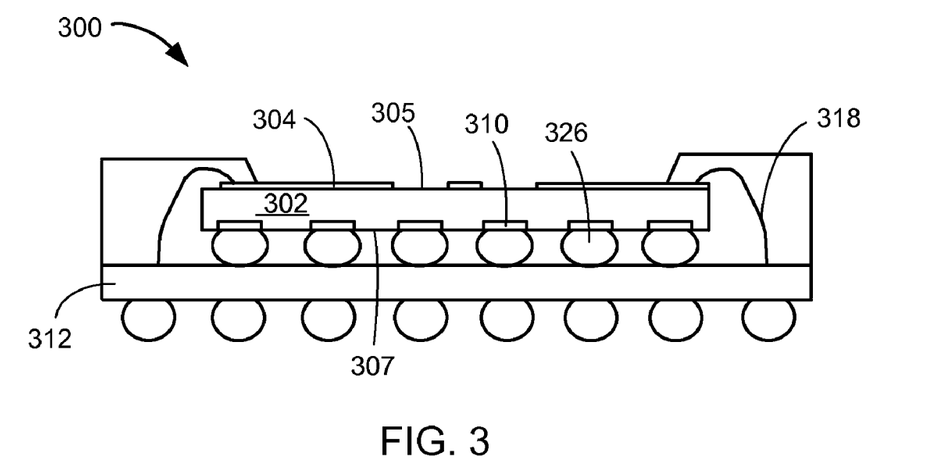
FIG. 3 is a cross-sectional view of an integrated circuit package system exemplified by the top view of FIG. 1 along line 2-2 in a second embodiment of the present invention.

Referring now to FIG. 3, is a cross-sectional view of an integrated circuit package system 300 exemplified by the top view of FIG. 1 along line 2-2 in a second embodiment of the present invention. The integrated circuit package system 300 includes structural similarities to the integrated circuit package system 100 of FIG. 2.

The cross-sectional view shows an integrated circuit 302, such as a flip chip, mounted over a carrier 312, such as a substrate. The integrated circuit 302 includes a non-active side 305 and an active side 307 with the active side 307 having active circuitry fabricated thereon. Device interconnects 326, such as solder balls, can connect connection sites 310, such as bond pads, at the active side 307 to the carrier 312.

A planar interconnect 304 can be formed along the non-active side 305. A first interconnect 318, such as bond wires or ribbon bond wires, can be connect to the carrier 312 and the planar interconnect 304.

Figure 4:
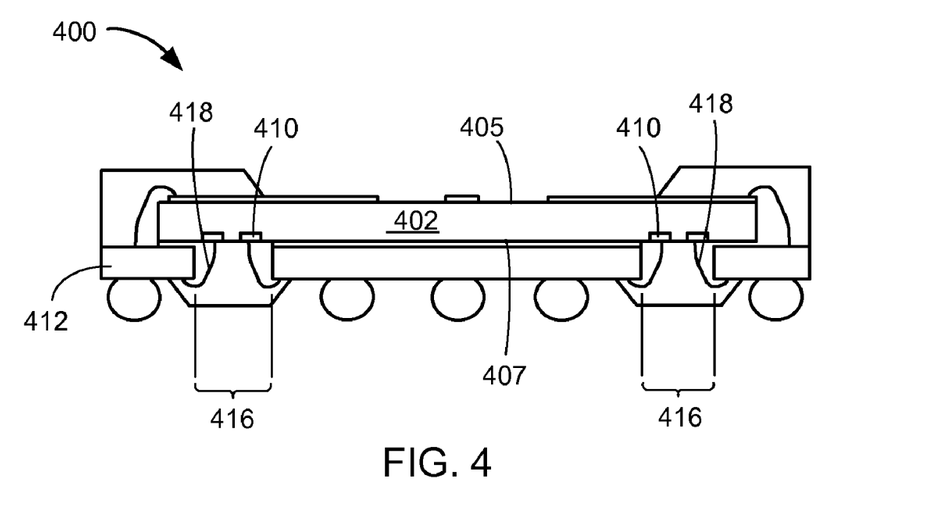
FIG. 4 is a cross-sectional view of the integrated circuit package system exemplified by the top view of FIG. 1 along line 2-2 in a third embodiment of the present invention.

Referring now to FIG. 4, therein is shown a cross-sectional view of an integrated circuit package system 400 exemplified by the top view of FIG. 1 along line 2-2 in a third embodiment of the present invention. The integrated circuit package system 400 includes structural similarities to the integrated circuit package system 100 of FIG. 2.

The integrated circuit package system 400 includes an integrated circuit 402, such as an integrated circuit die, having a non-active side 405 and an active side 407 with the active side 407 having active circuitry fabricated thereon. The integrated circuit 402 can mount over a carrier 412, such as a substrate, having openings 416.

The integrated circuit 402 can have connection sites 410, such as bond pads, at the active side 407. The connection sites 410 can be positioned over the both of the openings 416. A first interconnect 418, such as a bond wire or ribbon bond wire, can connect the connection sites 410 to the carrier 412 through the openings 416.

Figure 5:
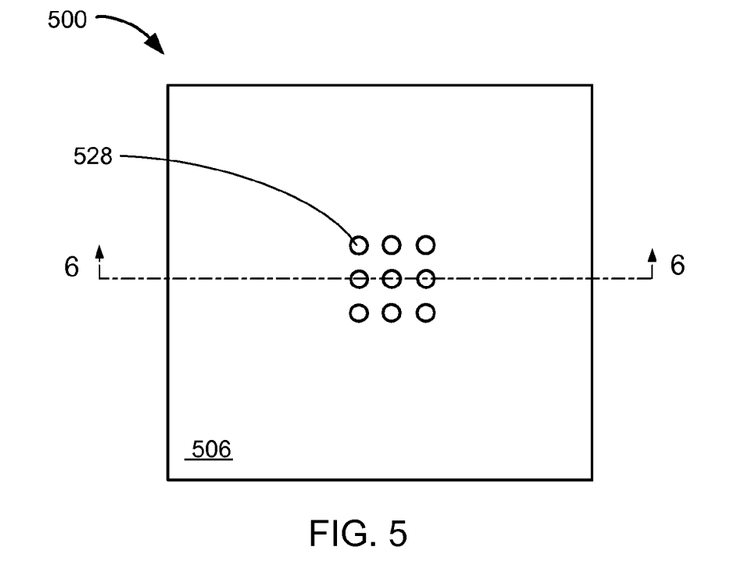
FIG. 5 is a top view of an integrated circuit package system a fourth embodiment of the present invention.

Referring now to FIG. 5, therein is shown a top view of an integrated circuit package system 500 a fourth embodiment of the present invention. The top view depicts an encapsulation 506, such as a cover including epoxy molding compound, formed around and exposing mounting interconnects 528, such as planarized solder bumps, planarized conductive posts, or planarized stud bumps.

For illustrative purposes, the integrated circuit package system 500 is shown having a square geometric configuration, although it is understood that the integrated circuit package system 500 can have a different geometric configuration. For example, the integrated circuit package system 500 can have a rectangular configuration.

Figure 6:
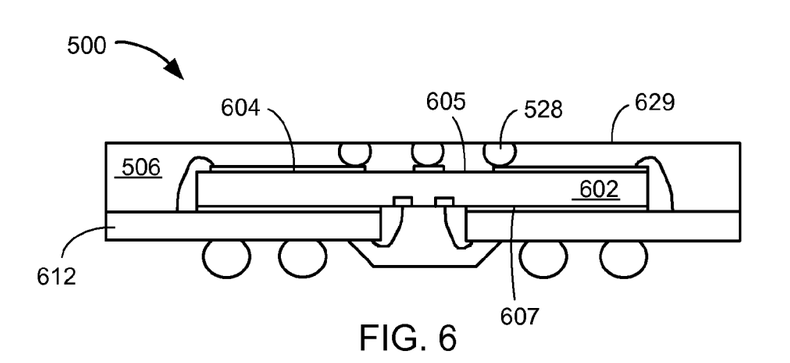
FIG. 6 is a cross-sectional view of an integrated circuit package system along line 6-6 of FIG. 5.

Referring now to FIG. 6, therein is shown a cross-sectional view of the integrated circuit package system 500 along line 6-6 of FIG. 5. The integrated circuit package system 500 includes structural similarities to the integrated circuit package system 100 of FIG. 2.

The mounting interconnects 528 can attach to a planar interconnect 604 along a non-active side 605 of an integrated circuit 602, such as an integrated circuit die. The integrated circuit 602 can include an active side 607 with the active side 607 having active circuitry fabricated thereon.

The encapsulation 506 can be formed over a carrier 612 covering the integrated circuit 602, the planar interconnect 604, and the mounting interconnects 528. The encapsulation 506 can continue in its formation with a removal or planarization process to ground or etched a top side 629 of the encapsulation 506 to expose the mounting interconnects 528. The encapsulation 506 provides structure rigidity to the mounting interconnects 528 to withstand mounting forces.

It has also been discovered that the present invention provides the integrated circuit package system that is formed with an encapsulation with a profile above the integrated circuit. This encapsulated mounting interconnects prevent die cracking by covering the non-active side and the planar interconnect with the encapsulation.

Figure 7:
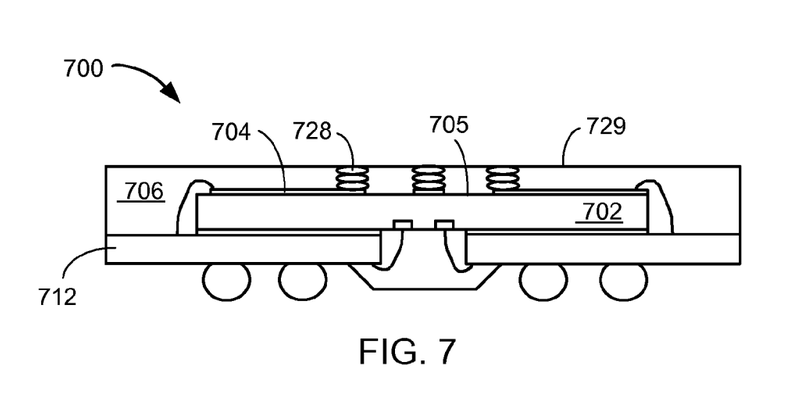
FIG. 7 is a cross-sectional view of an integrated circuit package system exemplified by the top view of FIG. 5 along line 6-6 in a fifth embodiment of the present invention.

Referring now to FIG. 7, therein is shown a cross-sectional view of an integrated circuit package system 700 exemplified by the top view of FIG. 5 along line 6-6 in a fifth embodiment of the present invention. The integrated circuit package system 700 includes structural similarities to the integrated circuit package system 100 of FIG. 2.

Mounting interconnects 728, such as stacked stud bumps, can attach to a planar interconnect 704 along a non-active side 705 of an integrated circuit 702, such as an integrated circuit die. The mounting interconnects 728 can be formed by a number of processes. For example, the mounting interconnects 728 can be formed with wire bonding machine forming the stack of wire bumps.

An encapsulation 706 can be formed over a carrier 712, such as a substrate, covering the integrated circuit 702, the planar interconnect 704, and the mounting interconnects 728. The encapsulation 706 can continue in its formation with a removal or planarization process to ground or etched a top side 729 of the encapsulation 706 to expose the mounting interconnects 728.

Figure 8:
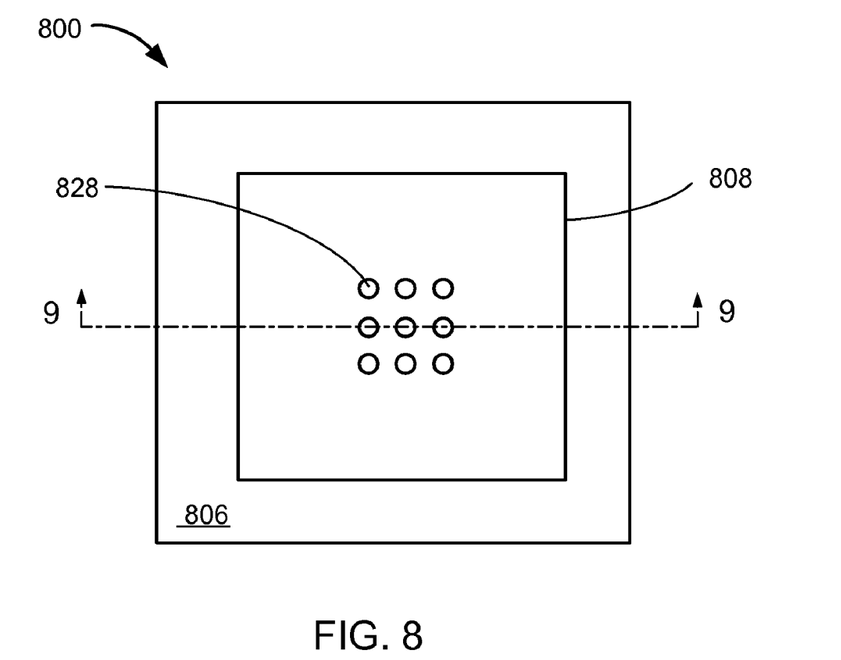
FIG. 8 is a top view of an integrated circuit package system in a sixth embodiment of the present invention.

Referring now to FIG. 8, therein is shown a top view of an integrated circuit package system 800 in a sixth embodiment of the present invention. The top view depicts an encapsulation 806, such as a cover including an epoxy molding compound, formed around mounting interconnects 828. The encapsulation 806 can include a cavity 808 exposing the mounting interconnects 828.

For illustrative purposes, the integrated circuit package system 800 is shown having a square geometric configuration, although it is understood that the integrated circuit package system 800 can have a different geometric configuration. For example, the integrated circuit package system 800 can have a rectangular configuration.

Figure 9:
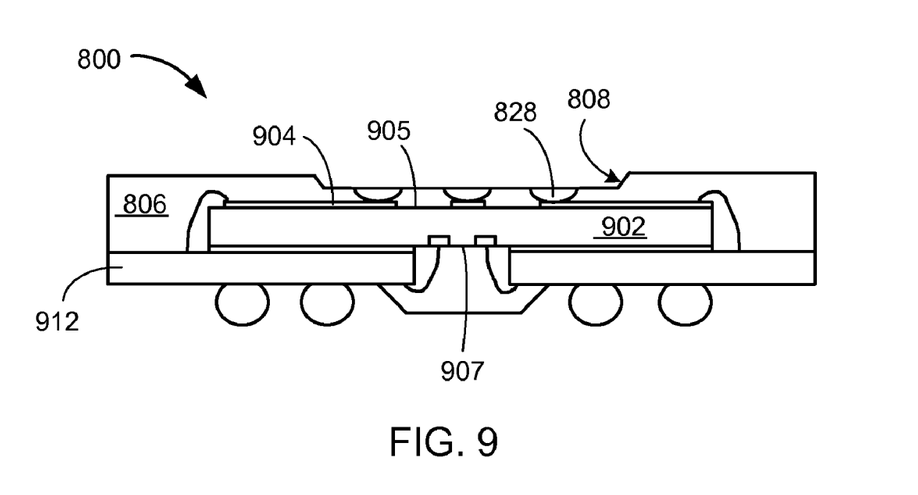
FIG. 9 is a cross-sectional view of the integrated circuit package system along 9-9 of FIG. 8.

Referring now to FIG. 9, therein is shown a cross-sectional view of the integrated circuit package system 800 along 9-9 of FIG. 8. The integrated circuit package system 800 includes structural similarities to the integrated circuit package system 100 of FIG. 2.

The mounting interconnects 828 can attach to a planar interconnect 904 along a non-active side 905 of an integrated circuit 902, such as an integrated circuit die. The integrated circuit 902 can include an active side 907 having active circuitry fabricated thereon. The encapsulation 806 can be formed over a carrier 912, such as a substrate, covering the integrated circuit 902 with the mounting interconnects 828 exposed in the cavity 808.

Figure 10:
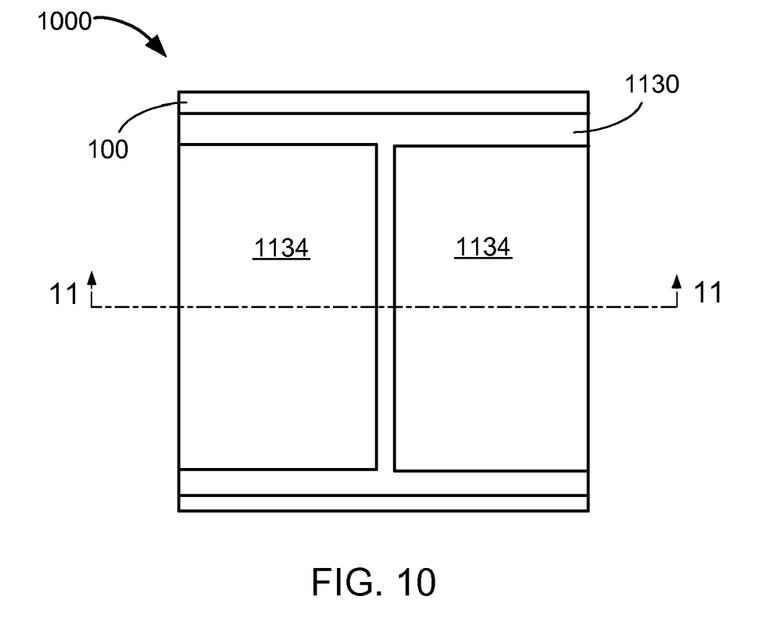
FIG. 10 is a top view of an integrated circuit package-on-package system in a first application example of the integrated circuit package system of FIG. 1 in a seventh embodiment of the present invention.

Referring now to FIG. 10, therein is shown a top view of an integrated circuit package-on-package system 1000 in a first application example of the integrated circuit package system 100 of FIG. 1 in a seventh embodiment of the present invention. The integrated circuit package-on-package system 1000 includes a mounting interposer 1130, such as a substrate interposer, mounted over the integrated circuit package system 100. Mounting devices 1134, such as packaged integrated circuits, flip chips, or passive devices, can mount over the mounting interposer 1130.

Figure 11:
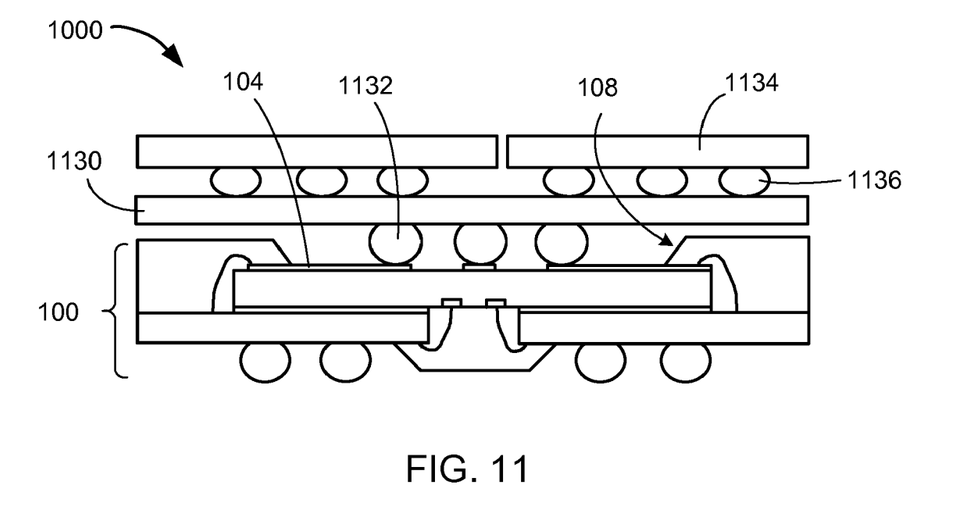
FIG. 11 is a cross-sectional view of the integrated circuit package-on-package system along line 11-11 of FIG. 10.

Referring now to FIG. 11, therein is shown a cross-sectional view of the integrated circuit package-on-package system 1000 along line 11-11 of FIG. 10. The mounting interposer 1130 can be mounted over the integrated circuit package system 100.

Interposer interconnects 1132, such as solder balls, can connect the mounting interposer 1130 the planar interconnect 104. The interposer interconnects 1132 can be located within the cavity 108 of the integrated circuit package system 100.

The mounting devices 1134 can be mounted over the mounting interposer 1130. The mounting devices 1134 can connect to the mounting interposer 1130 with device interconnects 1136, such as solder balls.

Figure 12:
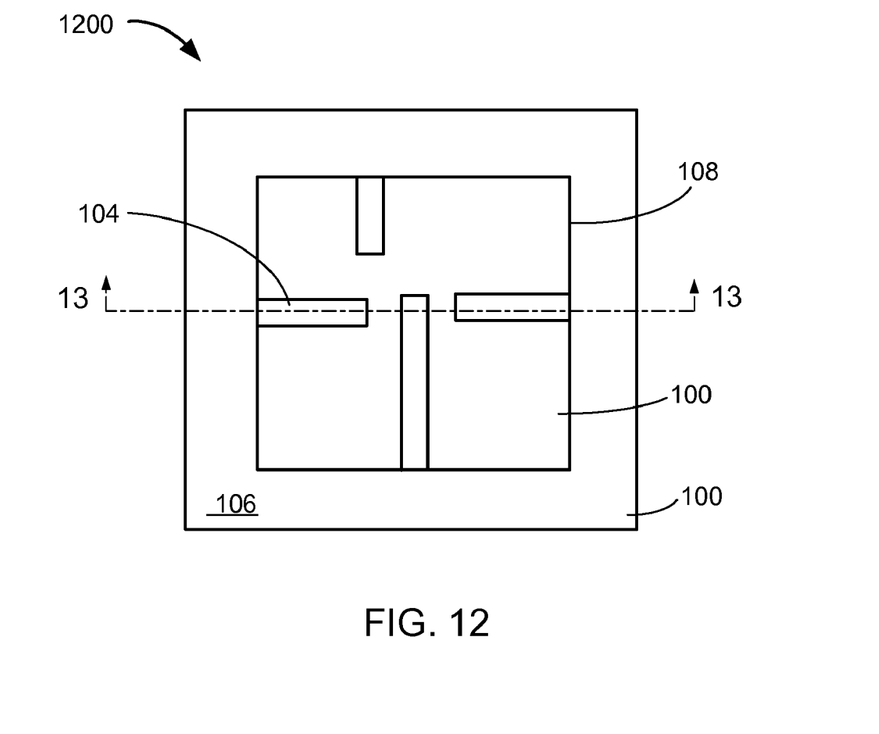
FIG. 12 is a top view of an integrated circuit package-on-package system in a second application example of the integrated circuit package system of FIG. 1 in an eighth embodiment of the present invention.

Referring now to FIG. 12, therein is shown a top view of an integrated circuit package-on-package system 1200 in a second application example of the integrated circuit package system 100 of FIG. 1 in an eighth embodiment of the present invention. The integrated circuit package system 100 having the planar interconnect 104 exposed with the cavity 108 in the encapsulation 106.

Figure 13:
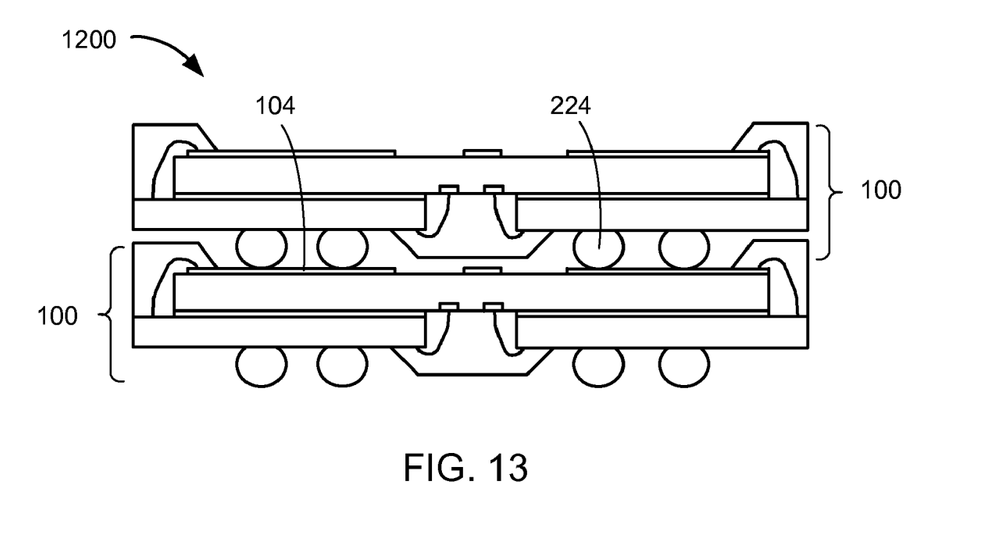
FIG. 13 is a cross-sectional view of the integrated circuit package-on-package system along line 13-13 of FIG. 12.

Referring now to FIG. 13, therein is shown a cross-sectional view of the integrated circuit package-on-package system 1200 along line 13-13 of FIG. 12. The integrated circuit package system 100 of FIG. 2 can be stacked forming the integrated circuit package-on-package system 1200.

The package interconnects 224 of the integrated circuit package system 100 at the top of the stack can connect to the planar interconnect 104 of the bottom of the stack. For illustrative purposes, the integrated circuit package system 100 is shown with two of the integrated circuit package system 100 stacked, although it is understood that in other embodiments can stack more than two of the integrated circuit package system 100.

Figure 14:
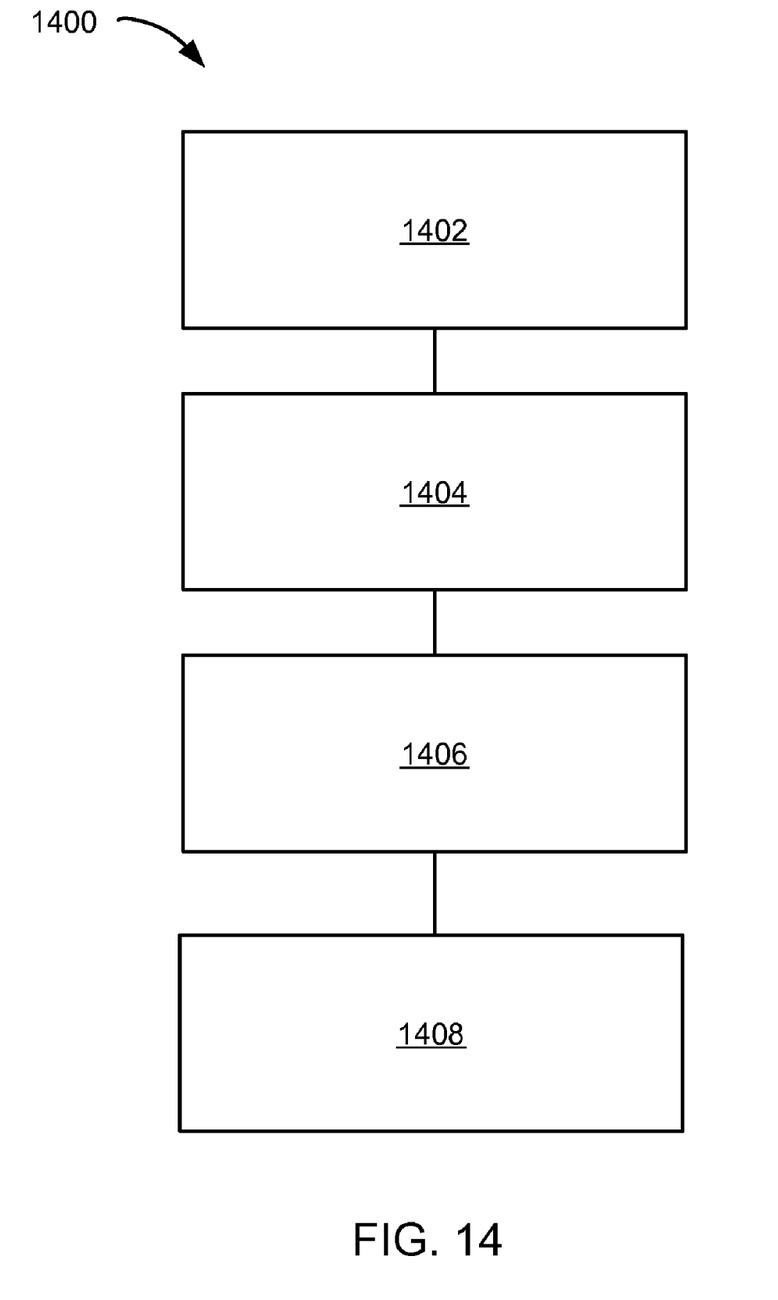
FIG. 14 is a flow chart of an integrated circuit packaging system for manufacture of the integrated circuit packaging system in an embodiment of the present invention.

Referring now to FIG. 14, therein is shown a flow chart of an integrated circuit package system 1400 for manufacture of the integrated circuit package system 100 in an embodiment of the present invention. The system 1400 includes mounting an integrated circuit, having a planar interconnect, over a carrier with the planar interconnect at a non-active side of the integrated circuit and an active side of the integrated circuit facing the carrier in a block 1402; connecting the integrated circuit and the carrier in a block 1404; connecting the planar interconnect and the carrier in a block 1406; and forming an encapsulation over the integrated circuit, the carrier, and the planar interconnect in a block 1408.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. An integrated circuit package system comprising:
   a carrier;
   an integrated circuit, having a planar interconnect, over the carrier with the planar interconnect, at a non-active side of the integrated circuit, connected to the carrier and an active side of the integrated circuit facing and connected to the carrier;
   a mounting interconnect over the planar interconnect; and
   an encapsulation over the integrated circuit, the carrier, and the planar interconnect, the encapsulation having a cavity with the mounting interconnect exposed with the cavity.

2. The system as claimed in claim 1 wherein the encapsulation includes a cavity with the planar interconnect exposed by the cavity.

3. The system as claimed in claim 1 wherein the carrier includes the carrier having an opening with the active side and the carrier connected through the opening.

4. The system as claimed in claim 1 further comprising a mounting interconnect over the planar interconnect and exposed from the encapsulation.

5. The system as claimed in claim 1 further comprising:
   an adhesive between the integrated circuit and the carrier; and
   a package interconnect below the carrier.

6. The system as claimed in claim 5 further comprising:
   a first interconnect between the active side and the carrier through an opening of the carrier; and
   wherein the encapsulation includes:
   the encapsulation through the opening for covering the first interconnect.

7. The system as claimed in claim 5 further comprising a mounting device over the planar interconnect.

8. The system as claimed in claim 5 further comprising a mounting interposer over the planar interconnect.

9. The system as claimed in claim 5 further comprising a device interconnect between the active side and the carrier with the device interconnect over the carrier.

* * * * *